United States Patent
Bellocchi et al.

(10) Patent No.: US 12,374,545 B2
(45) Date of Patent: Jul. 29, 2025

(54) PROCESS FOR WORKING A WAFER OF 4H—SiC MATERIAL TO FORM A 3C—SiC LAYER IN DIRECT CONTACT WITH THE 4H—SiC MATERIAL

(71) Applicant: STMICROELECTRONICS S.r.l., Agrate Brianza (IT)

(72) Inventors: Gabriele Bellocchi, Catania (IT); Simone Rascuna', Catania (IT); Paolo Badala', Acireale (IT); Anna Bassi, Gravina di Catania (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 123 days.

(21) Appl. No.: 18/181,415

(22) Filed: Mar. 9, 2023

(65) Prior Publication Data
US 2023/0298887 A1 Sep. 21, 2023

(30) Foreign Application Priority Data
Mar. 18, 2022 (IT) .................. 102022000005357

(51) Int. Cl.
*H01L 21/02* (2006.01)
*H01L 21/306* (2006.01)

(52) U.S. Cl.
CPC .. *H01L 21/02378* (2013.01); *H01L 21/02164* (2013.01); *H01L 21/02527* (2013.01); *H01L 21/02675* (2013.01); *H01L 21/30604* (2013.01)

(58) Field of Classification Search
CPC ......... H01L 21/02378; H01L 21/02164; H01L 21/02527; H01L 21/02675;
(Continued)

(56) References Cited

U.S. PATENT DOCUMENTS 9,761,669 B1 * 9/2017 Arnold ............... H01L 21/0262
2016/0254148 A1 * 9/2016 Kitamura ............. H01L 21/046
257/77

(Continued)

OTHER PUBLICATIONS

Choi et al, Laser-induced phase separation of silicon carbide, Nov. 30, 2016, Nat Commun 7, 13562, 2-6.*

(Continued)

*Primary Examiner* — Ajay Ojha
*Assistant Examiner* — Sandra Milena Rodriguez Villanu
(74) *Attorney, Agent, or Firm* — Seed IP Law Group LLP

(57) ABSTRACT

Process for manufacturing a 3C—SiC layer, comprising the steps of: providing a wafer of 4H—SiC, provided with a surface; heating, through a LASER beam, a selective portion of the wafer at least up to a melting temperature of the material of the selective portion; allowing the cooling and crystallization of the melted selective portion, thus forming the 3C—SiC layer, a Silicon layer on the 3C—SiC layer and a carbon-rich layer above the Silicon layer; completely removing the carbon-rich layer and the Silicon layer, exposing the 3C—SiC layer. If the Silicon layer is maintained on the 4H—SiC wafer, the process leads to the formation of a Silicon layer on the 4H—SiC wafer. The 3C—SiC or Silicon layer thus formed may be used for the integration, even only partial, of electrical or electronic components.

20 Claims, 4 Drawing Sheets

(58) Field of Classification Search
CPC ......... H01L 21/30604; H01L 21/02447; H01L 21/0245; H01L 21/02502; H01L 21/02612; H01L 21/02686; H01L 21/02529; H01L 21/02104; H01L 21/02318; H01L 21/32105; H10D 62/8325; C01B 32/956
See application file for complete search history.

(56) References Cited

U.S. PATENT DOCUMENTS

| | | |
|---|---|---|
| 2023/0299148 A1 | 9/2023 | Rascuna' et al. |
| 2023/0299173 A1 | 9/2023 | Rascuna' et al. |

OTHER PUBLICATIONS

Choi et al., "Laser-induced phase separation of silicon carbide," *Nature Communications* 17:13562: 1-7, Nov. 2016.

Dombsky et al., "Release of Al from SiC targets used for radioactive ion beam production," *Nuclear Instruments and Methods in Physics Research B 264*:125-139, 2016.

Jokubavicius et al., "Lateral Enlargement Growth Mechanism of 3C—SiC on Off-Oriented 4H—SiC Substrates," *Crystal Growth & Design 14*:6514-6520, 2014.

Jokubavicius et al., "Single Domain 3C—SiC Growth on Off-Oriented 4H—SiC Substrates," *Crystal Growth & Design 15*, 2940-2947, 2015.

Soueidan et al., "A Vapor-Liquid-Solid Mechanism for Growing 3C—SiC Single-Domain Layers on 6H—SiC(0001)," *Advanced Functional Materials 16*:975-979, 2006.

Wang et al., "Synthesis of graphene and graphene nanostructures by ion implantation and pulsed laser annealing," *Journal of Applied Physics 120*(025105): 1-9, 2016.

Yakimova et al., "Growth, Defects and Doping of 3C—SiC on Hexagonal Polytypes," *ECS Journal of Solid State Science and Technology 6*(10):P741-P745, 2017. (6 pages).

\* cited by examiner

PROCESS FOR WORKING A WAFER OF 4H—SiC MATERIAL TO FORM A 3C—SiC LAYER IN DIRECT CONTACT WITH THE 4H—SiC MATERIAL

BACKGROUND

Technical Field

The present disclosure relates to a process for working a 4H—SiC wafer, in order to form a layer with a reduced bandgap with respect to 4H—SiC, such as for example a 3C—SiC or Silicon layer, on the 4H—SiC wafer.

Description of the Related Art

As known, semiconductor devices are typically manufactured in silicon wafers. However, silicon carbide (SiC) wafers have become increasingly popular owing, at least in part, to the favorable physico-chemical properties of SiC. For example, SiC generally has a higher bandgap with respect to silicon, with the consequence of obtaining a greater barrier height when, for example, a Schottky contact is formed. Moreover, the breakdown voltage of SiC is also greater than that of silicon. This is due to the fact that the critical electric field of SiC is about ten times greater than that of silicon. In general, an advantage associated with the manufacturing of a device on a substrate (bulk) of 4H—SiC is maintaining the advantage in breakdown voltage, but having on the surface a material that has a lower bandgap (for example, silicon or 3C—SiC), so as to have a reduction of the barrier height, for example, of the Schottky contact. In other words, maintaining the advantage in reverse bias and optimizing the voltage drop in forward bias is desirable.

Silicon carbide (SiC) comes in different crystalline forms, also called polytypes. The most common polytypes are the cubic polytype (polytype 3C—SiC), the hexagonal polytype (polytypes 4H—SiC and 6H—SiC) and the rhombohedral polytype (polytype 15R—SiC). Among these, the cubic polytype 3C—SiC is currently being studied in depth, owing to its unique properties compared to other wafer polytypes. The polytype 3C—SiC offers several advantages for Metal Oxide Semiconductor (MOS) device applications, for example it may help increase drift mobility with its reduced Oxide/3C—SiC interface trap density. The reduced bandgap of 3C—SiC helps reduce the electric field strength necessary to obtain the channel inversion. Other characteristics that make 3C—SiC interesting consist in the low value of the on-state resistance Ron, particularly useful in case of devices that work up to and over 650 V.

For the greater ease of manufacture with respect to other polytypes, 4H—SiC is commonly used as a substrate. However, the bandgap of 4H—SiC is greater (3.2 eV) with respect to the corresponding bandgap of 3C—SiC (2.3 eV) or Silicon (1.12 eV), making 4H—SiC less attractive for some electronic applications with respect to 3C—SiC or with respect to Silicon. For example, in case of Schottky barrier diodes, the possibility of controlling the Schottky Barrier Height (SBH) is an important aspect in order to reduce energy consumption and minimize conduction losses. To this end, the implementation of metal/3C—SiC or metal/Si contacts entails lower SBH values with respect to the SBH values of metal/4H—SiC contacts, enabling the manufacturing of more efficient Schottky diodes.

Different methods have been proposed for growing cubic silicon carbide (3C—SiC) on a hexagonal silicon carbide (4H—SiC or 6H—SiC) substrate. One of these is known as Vapor-Liquid-Solid (VLS) mechanism, for example described by Soueidan M. et al., "A Vapor-Liquid-Solid Mechanism for Growing 3C—SiC Single-Domain Layers on 6H—SiC (0001)," Advanced Functional Materials, vol. 16, pages 975-979, 02 May 2006.

Another method is known as Sublimation Epitaxy (SE).

However, the above-mentioned methods require a plurality of growth steps and a high control of the surface morphology (especially as regards the layers, or films, grown with the SE method on an off-axis 4H—SiC substrate).

An alternative to the techniques discussed above for manufacturing a 3C—SiC layer is chemical vapor deposition (CVD) on a Silicon substrate. However, the 3C—SiC layers thus formed have a high defect density (in the order of $10^8$-$10^9$ per $cm^2$, which results from about 20% of lattice mismatching between the two materials).

Other solutions have also been proposed, such as for example the heteroepitaxial growth of 3C—SiC on an in-axis 6H—SiC substrate, for example by CVD technique or by sublimation. However, the high number of parameters to be set to obtain a final product having good quality and the numerous variables that affect the formation of the 3C—SiC layer, limit the use of known methods, especially in the industrial and mass production fields.

BRIEF SUMMARY

The present disclosure provides at least one embodiment of a process for working a 4H—SiC wafer in such a way as to overcome the drawbacks and limitations of the prior art.

At least one embodiment of a process for working a wafer of 4H—SiC material the present disclosure may includes the steps of: heating, through a LASER beam, a selective portion at a surface of the wafer at least up to a melting temperature of the material of said selective portion; allowing the crystallization of the melted selective portion, thus forming a stack of superimposed layers including: a 3C—SiC layer in contact with the 4H—SiC material of the wafer, a Silicon layer above the 3C—SiC layer, and a carbon-rich layer above the Silicon layer; and completely removing said carbon-rich layer.

BRIEF DESCRIPTION OF THE SEVERAL VIEWS OF THE DRAWINGS

For a better understanding of the present disclosure, preferred embodiments thereof are now described, purely by way of non-limiting example, with reference to the attached drawings, wherein.

DETAILED DESCRIPTION

With reference to FIGS. 1A-1F, a method for forming a silicon carbide layer of the polytype 3C—SiC according to an embodiment of the present disclosure is illustrated and described. FIGS. 1A-1F are represented in a triaxial reference system of X, Y, Z axes orthogonal to each other.

Figure 1A:
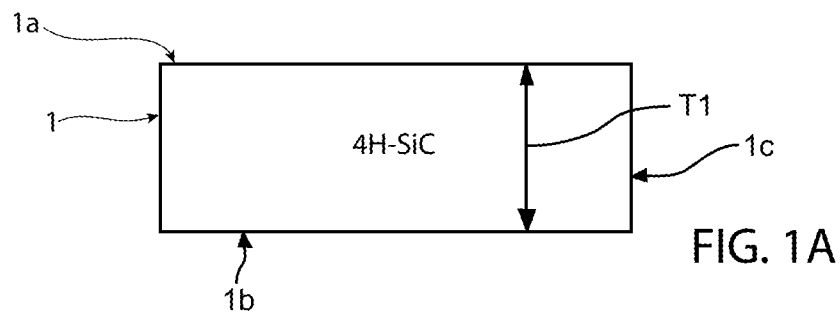
FIGS. 1A-1F illustrate successive steps of a process for manufacturing a 3C—SiC layer, according to an embodiment of the present disclosure.

With reference to FIG. 1A, a wafer 1 of silicon carbide of the polytype 4H—SiC, particularly crystalline 4H—SiC, even more particularly single-crystal 4H—SiC, is provided. The wafer 1 includes a front side 1a and a rear side 1b, opposite to each other along the Z axis. The wafer 1 has, in one embodiment, a first electrical conductivity type, for example an N-type conductivity, and doping in the range $10^{18}$-$10^{22}$ atoms/cm$^3$. The wafer 1 has, for example, a thickness or dimension T1 as shown in FIG. 1A, measured along the Z axis, equal to about 100-400 μm. A transverse side 1c extends from the front side 1a to the rear side 1b and is transverse to the front side 1a and the rear side 1b. The front side 1a includes a front surface and the rear side 1b includes a rear surface. The front surface may be referred to as a first surface, and the rear surface may be referred to as a second surface.

In general, the present disclosure applies to any 4H—SiC substrate.

In a further embodiment, the wafer 1 has a different conductivity (i.e., of a P-type). However, for the purposes of the present disclosure, the conductivity or starting doping type of the wafer 1 is not relevant.

The wafer 1 is manufactured in a per se known manner and is not an object of the present invention. However, 4H—SiC wafers are commercially available.

Figure 1B:
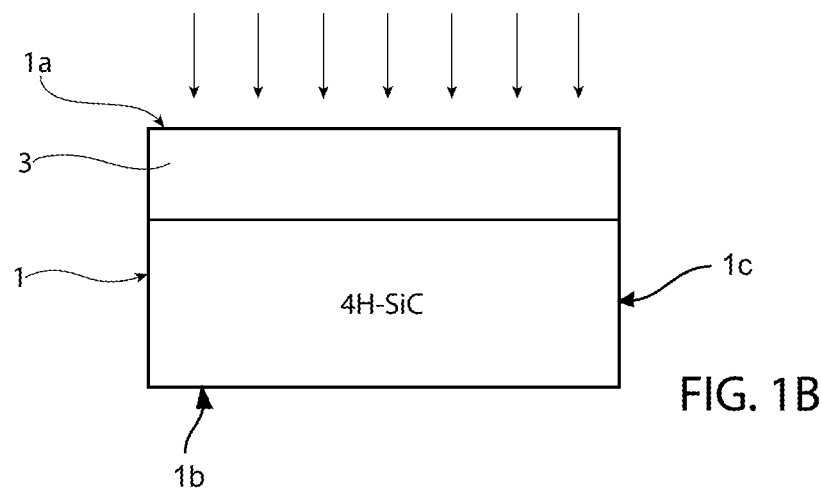

With reference to FIG. 1B, an implant (identified by arrows 2, parallel to the Z axis) step of doping species is performed. The implant occurs at the front side 1a and is performed in the absence of an implant mask (the use of an implant mask may still be provided, based on the needs and design choices).

A doped layer 3 is thus formed which extends uniformly at the front side 1a. The doped layer 3 extends in depth into the wafer 1, and reaches a maximum depth comprised between 100 nm and 1000 nm, measured from the surface of the front side 1a.

The doping step of FIG. 1B may provide, in one embodiment, a doping with doping species having the first electrical conductivity (N), for example nitrogen (N) and phosphorus (P). The implant is performed with implant energy comprised between 20 and 500 keV and with doses between $10^{14}$ and $10^{16}$ atoms/cm$^2$, to form the doped layer 3 with a dopant concentration comprised between $10^{17}$ and $10^{20}$ atoms/cm$^3$.

The doping step of FIG. 1B may provide, in a different embodiment, a doping with doping species having a second electrical conductivity (P) opposite to the first conductivity, for example Aluminum. The implant is performed with implant energy comprised between 20 and 500 keV and with doses between $10^{14}$ and $10^{16}$ atoms/cm$^2$, to form the doped layer 3 with a dopant concentration comprised between $10^{17}$ and $10^{20}$ atoms/cm$^3$.

The implant step "breaks" the crystalline structure of 4H—SiC, making the melting step described herein below performable at lower temperatures with respect to the case of crystalline material (as for example in the case described at FIG. 3B).

Figure 1C:
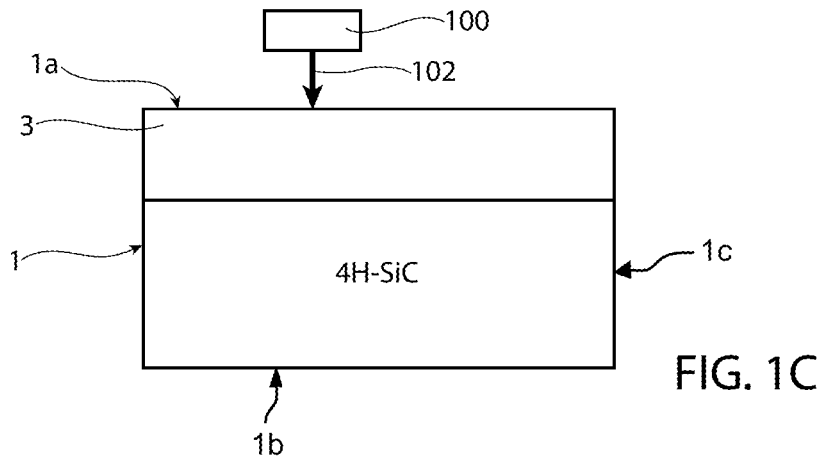

Subsequently, FIG. 1C, a thermal budget is generated at the surface of the front side 1a for causing a local melt of a portion of the wafer 1 at the front side 1a.

To this end, a LASER source 100 is used configured to generate a beam 102 such that it heats the front side 1a, and in particular the doped layer 3, up to a temperature comprised between about 1600° C. and 3000° C. Given the maximum depth reached by the doped layer 3, a temperature of about 2000° C. at the level of the surface of the front side 1a is sufficient to ensure temperatures within the range identified above even at the maximum depth reached by the doped layer 3.

Figure 1D:
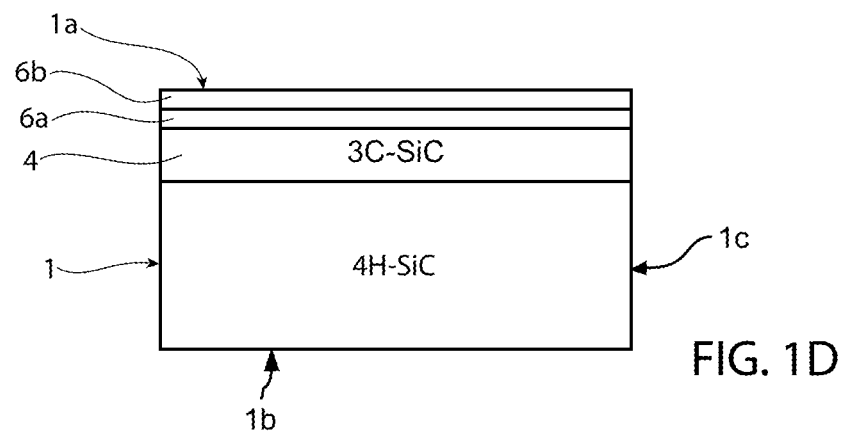

This temperature is, as said, such that it causes the melting of the doped layer 3; by interrupting the generation of the beam 102, that is interrupting the heating of the wafer 1, the re-solidification of the portions previously being melted and a crystallization thereof are observed. In particular, the Applicant has observed that the crystallization of the wafer 1 generates a plurality of superimposed layers, including a 3C—SiC layer 4 on the 4H—SiC material not being melted, a silicon layer 6a on the 3C—SiC layer 4 and one or more carbon-rich layers 6b (comprising for example one or more graphite layers and/or one or more graphene layers) on the silicon layer 6a, as illustrated in FIG. 1D.

The generation of the aforementioned layers by melting and subsequent crystallization of a 4H—SiC substrate is confirmed for example by Choi, I., Jeong, H., Shin, H. et al., "Laser-induced phase separation of silicon carbide," Nature Communications 7, 13562 (2016).

In one embodiment, the transformation of the doped layer 3 into layers 4, 6a and 6b occurs by heating the entire front side 1a of the wafer 1, suitably moving the LASER 100. For example, a plurality of scannings of the LASER 100 are carried out on the XY plane (e.g., a plurality of scannings parallel to each other and to the X axis and/or Y axis).

In a further embodiment, only a predefined portion of the doped layer 3 is processed by LASER 100, to obtain the formation of the 3C—SiC layer exclusively in some regions of the wafer 1 and not in others (for example only at regions wherein there will be formed active areas of devices which are intended to be provided/integrated in the wafer 1). This region or these regions may be spaced inward from a plurality of transverse sides 1c of the wafer 1.

The LASER 100 is, for example, an excimer UV LASER. Other types of LASERs may be used, including LASERs with wavelength in the region of the visible.

The configuration and operating parameters of the LASER 100, optimized to achieve the aim of the present disclosure according to the embodiment of FIGS. 1A-1D, are the following:
- wavelength between 290 and 370 nm, in particular 310 nm;
- pulse duration between 100 ns and 300 ns, in particular 160 ns;
- number of pulses between 1 and 16, in particular between 1 and 10, for example, 2;
- energy density between 1.6 and 4 J/cm$^2$, in particular 2.6 J/cm$^2$ (considered at the level of the surface of the front side 1a);
- temperature between 1400° C. and 3000° C., in particular 1800° C. (considered at the level of the surface 1a).

The area of the spot of the beam 102 at the level of the front side 1a is, for example, comprised between 0.7 and 1.5 cm$^2$.

The crystallization of the portion(s) being melted occurs in an environment with a temperature comprised between 1600° C. and 2700° C., in a time comprised between 100 ns and 300 ns.

Figure 1E:
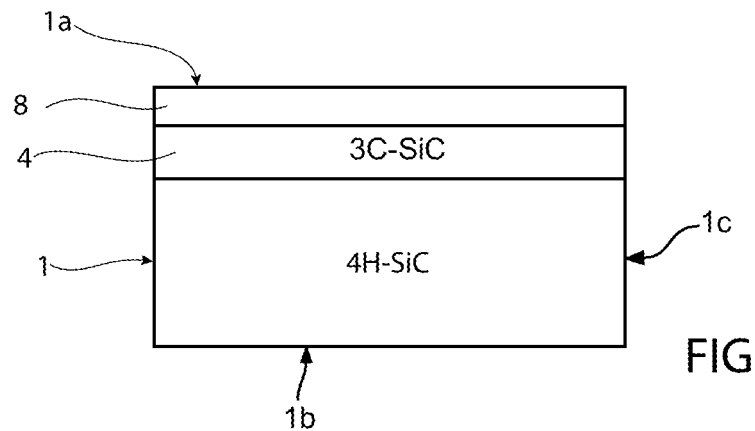

Then, FIG. 1E, an oxidation step of the carbon-rich layer 6b and of the underlying silicon layer 6a is performed, forming respective oxidized layers (indicated together with the reference 8 in FIG. 1E). This step is performed by inserting the wafer 1 into a furnace at a temperature of 800° C. for 60 min in an oxidizing environment, such as for example an oxygen-rich atmosphere. This favors the oxidation of both the carbon-rich layer and the silicon layer. The Applicant has not observed a corresponding oxidation of the 3C—SiC layer and of the 4H—SiC substrate.

Figure 1F:
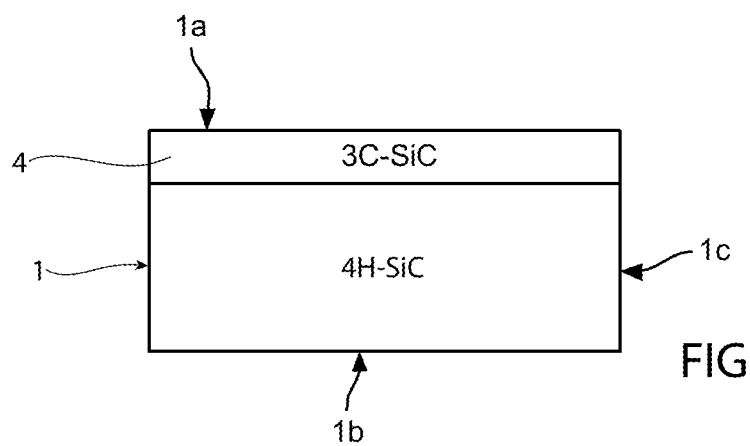

Then, FIG. 1F, a subsequent bath in a suitable wet etching solution, such as for example BOE (Buffered Oxide Etchant), allows the complete removal of the oxidized layers 8, exposing the underlying 3C—SiC layer 4.

Since the etching chemical solution selectively removes the material of the oxidized layers 8, the etching proceeds up to complete removal of the oxidized layers 8, without removing the underlying 3C—SiC layer 4.

Figure 2:
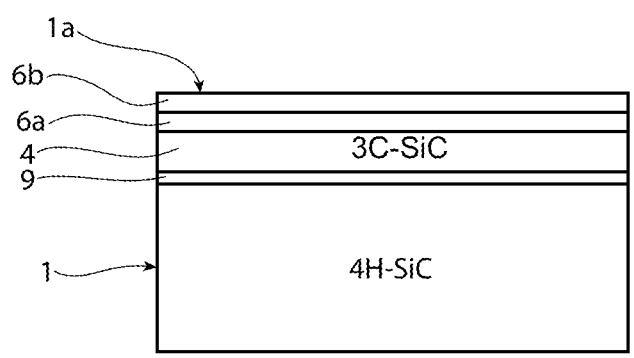
FIG. 2 illustrates a step of a process for manufacturing a 3C—SiC layer, according to a further embodiment of the present disclosure.

In a further embodiment of the present disclosure, illustrated in FIG. 2, after performing the steps already described with reference to FIGS. 1A-1C, the melting and subsequent re-solidification (re-crystallization) of the material of the wafer 1 lead to the formation of a further 6H—SiC layer 9 intermediate between the 4H—SiC material of the wafer 1 and the 3C—SiC layer 4.

The formation of the 6H—SiC layer 9 is caused by a suitable choice of the thermal budget that is provided to the 4H—SiC wafer through the LASER 100, that is by adjusting the configuration and operating parameters of the LASER 100 during the melting step of the portion of the wafer being processed. The subsequent crystallization of the melted portion leads, in a natural manner (i.e., not mediated by a further intervention by the operator), to the additional formation of the 6H—SiC layer 9. The configuration/operating parameters of the LASER 100 (i.e., of the radiation emitted by the LASER) are the following:

wavelength between 290 and 370 nm, in particular 310 nm;

pulse duration between 100 ns and 300 ns, in particular 160 ns;

number of pulses between 1 and 16, in particular between 1 and 10, and, for example, 2;

energy density between 1.6 and 4 J/cm$^2$, in particular 2.6 J/cm$^2$ (considered at the level of the surface of the front side 1a);

temperature between 1400° C. and 2600° C., in particular 1800° C. (considered at the level of the surface 1a).

The crystallization of the portion(s) being melted occurs in an environment with a temperature comprised between 1600° C. and 2700° C., in a time comprised between 100 ns and 300 ns.

Then, the oxidation and etching steps already described with reference to FIGS. 1E and 1F are performed.

FIGS. 3A-3E illustrate a further embodiment of the present disclosure. FIGS. 3A-3E are depicted in a triaxial reference system of X, Y, Z axes orthogonal to each other.

Figure 3A:
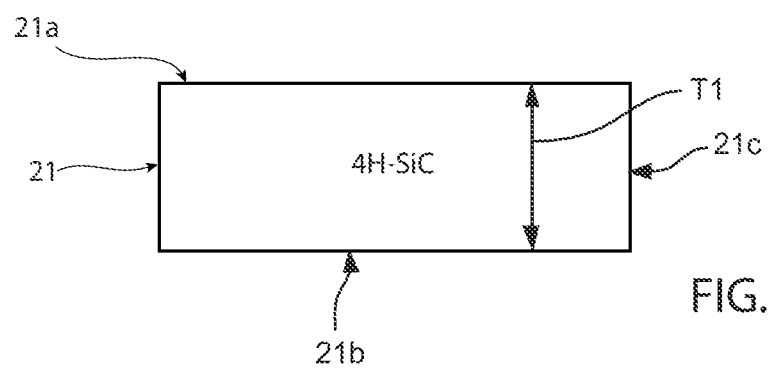
FIGS. 3A-3E illustrate successive steps of a process for manufacturing a 3C—SiC layer, according to a further embodiment of the present disclosure.

With reference to FIG. 3A, a wafer 21 of silicon carbide of the polytype 4H—SiC, particularly crystalline 4H—SiC, even more particularly single-crystal 4H—SiC, is provided. The wafer 21 includes a front side 21a and a rear side 21b, opposite to each other along the Z axis. The wafer 21 has, in one embodiment, a first electrical conductivity type, for example an N-type conductivity, and doping in the range 1e18-1e22 atoms/cm$^3$. A transverse side 21c extends from the front side 21a to the rear side 21b and is transverse to the front side 21a and the rear side 21b. The front side 21a includes a front surface and the rear side 21b includes a rear surface. The front surface may be referred to as a first surface, and the rear surface may be referred to as a second surface.

The wafer 21 has, for example, the thickness T1, measured along the Z axis, equal to about 100 and 400 µm.

In a further embodiment, the wafer 21 has a different conductivity (i.e., of a P-type). However, for the purposes of the present disclosure the conductivity or starting doping type of the wafer 21 is not relevant.

The wafer 1 is manufactured in a per se known manner and is not an object of the present invention. However, 4H—SiC wafers are commercially available.

Subsequently, FIG. 3B, a thermal budget is generated at the surface of the front side 21a for causing a local melt of a portion of the wafer 21 at the front side 21a.

To this end, the LASER source 100 is used, configured to generate the beam 102 for heating the front side 21a up to a temperature equal to about 1600-3000° C. A temperature of about 3000° C. at the level of the surface of the front side 21a is sufficient to ensure temperatures within the range identified above in depth in the wafer 21, for example equal to about 10 µm. This temperature is such that it causes a melting of the portions of the wafer 21 being processed through LASER 100. By interrupting the generation of the beam 102, that is by interrupting the heating of the wafer 21, the re-solidification of the portions being melted and, in particular, a re-crystallization thereof in predefined and predictable forms are observed. In particular, the Applicant has observed that the crystallization of the wafer 21 generates a plurality of superimposed layers, including a 3C—SiC layer 24 on the 4H—SiC material not being melted, a silicon layer 26a on the 3C—SiC layer 24 and one or more carbon-rich layers 26b (including for example graphite layers, or graphene multi-layers) on the silicon layer 26a, as illustrated in FIG. 3C.

In one embodiment, the transformation of portions of the wafer 1 into layers 24, 26a and 26b occurs by heating the entire front side 21a of the wafer 21, suitably moving the LASER 100. For example, a plurality of scannings of the LASER 100 are carried out on the XY plane (e.g., a plurality of scannings parallel to each other and to the X axis and/or Y axis). In a further embodiment, only some regions (in XY plane top view) of the wafer 1 are processed by LASER 100, to obtain the formation of the 3C—SiC layer 24 exclusively in some regions of the wafer 21 and not in others (for example only at regions wherein there will be formed active areas of devices which are intended to be provided/integrated in the wafer 21). This region or these regions may be spaced inward from a plurality of transverse sides 1c of the wafer 1.

Figure 3B:
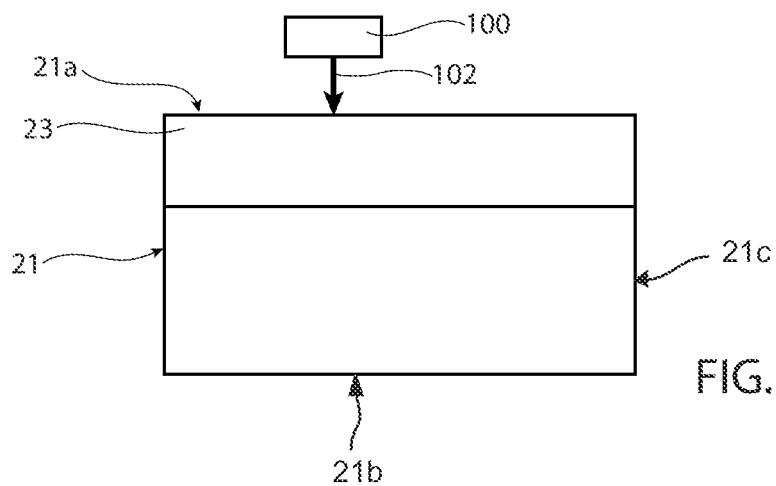
Figure 3C:
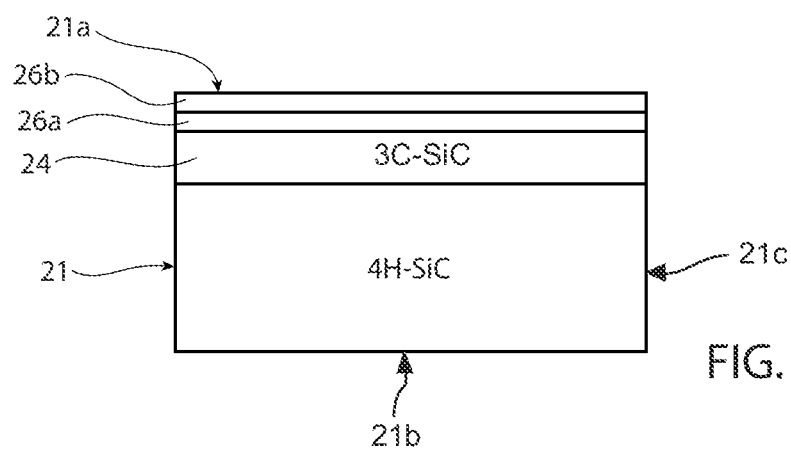

The configuration and operating parameters of the LASER 100, optimized to achieve the aim of the present disclosure according to the embodiment of FIGS. 3A-3C, are the following:

wavelength between 290 and 370 nm, in particular 310 nm;

pulse duration between 100 ns and 300 ns, in particular 160 ns;

number of pulses between 1 and 16, in particular between 1 and 10, and, for example, 2;

energy density between 1.6 and 5 J/cm$^2$, in particular 3.8 J/cm$^2$ (considered at the level of the surface of the front side 1a);

temperature between 2000° C. and 3000° C., in particular 2600° C. (considered at the level of the surface 1a).

The area of the spot of the beam 102 at the level of the front side 1a is, for example, comprised between 0.7 and 1.5 cm$^2$.

The crystallization of the portion(s) being melted occurs in an environment with a temperature comprised between 1600 and 2700° C., in a time comprised between 100 ns and 300 ns.

Figure 3D:
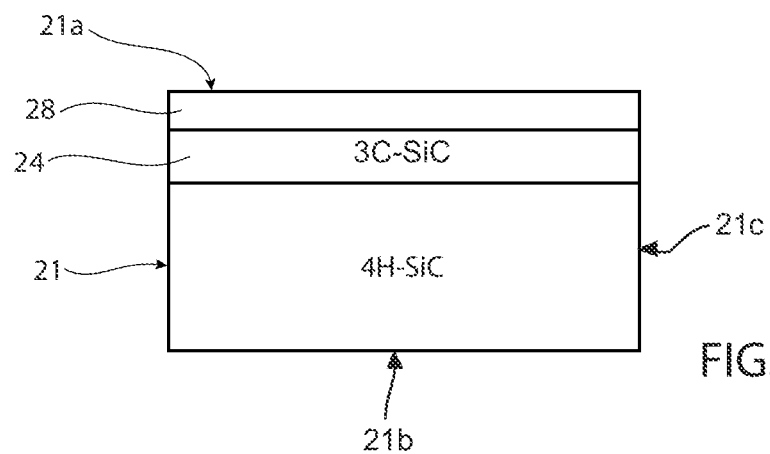

Then, FIG. 3D, an oxidation step of the silicon layer 26a and of the carbon-rich layer 26b is performed, similarly to what has been previously described, forming respective oxidized layers (indicated in the Figure with the generic reference 28).

This step is performed by inserting the wafer 21 into a furnace at a temperature of 800° C. for 60 min in an oxidizing environment and, in particular, in an oxygen environment. This favors the oxidation of both the carbon-rich layer and the silicon layer. The Applicant has not observed a corresponding oxidation of the 3C—SiC layer and of the 4H—SiC substrate.

Figure 3E:
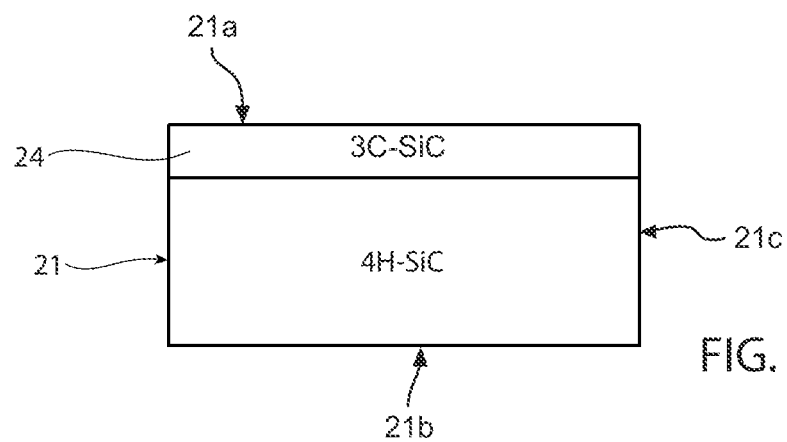

Then, FIG. 3E, a subsequent bath in a suitable wet etching solution, such as for example BOE (Buffered Oxide Etchant), allows the complete removal of the oxidized layers 28, exposing the underlying 3C—SiC layer 24.

Since the etching chemical solution selectively removes the material of the oxidized layers 28, the etching proceeds up to complete removal of the same, without removing the underlying 3C—SiC layer 24.

Figure 4:
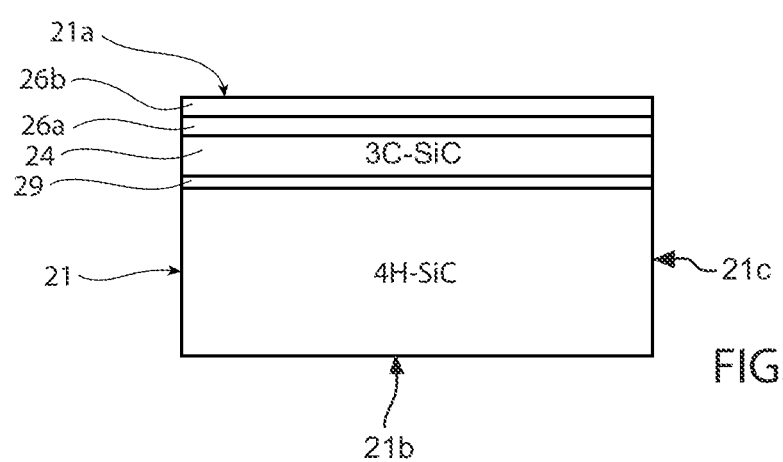
FIG. 4 illustrates a step of a process for manufacturing a 3C—SiC layer, according to a further embodiment of the present disclosure.

In a further embodiment of the present disclosure, illustrated in FIG. 4, after performing the steps already described with reference to FIGS. 3A-3B, the melting and subsequent re-crystallization of the material of the wafer 21 lead to the formation of a further 6H—SiC layer 29 intermediate between the 4H—SiC material of the wafer 21 and the 3C—SiC layer 24.

The formation of the 6H—SiC layer 29 is caused (as already discussed with reference to FIG. 2) by suitably adjusting the configuration and operating parameters of the LASER 100, for the emission of a suitable beam, as follows:
  wavelength between 290 and 370 nm, in particular 310 nm;
  pulse duration between 100 ns and 300 ns, in particular 160 ns;
  number of pulses between 1 and 16, in particular between 1 and 10, and, for example, 2;
  energy density between 1.6 and 4 $J/cm^2$, in particular 2.6 $J/cm^2$ (considered at the level of the surface of the front side 1a);
  temperature between 1400° C. and 2600° C., in particular 1800° C. (considered at the level of the surface 1a).

The crystallization of the portion(s) being melted occurs in an environment with a temperature comprised between 1600° C. and 2700° C., in a time comprised between 100 ns and 300 ns.

Then, the oxidation and etching steps already described with reference to FIGS. 3D, 3E are performed.

From an examination of the characteristics of the disclosure provided according to the present description, the advantages that it affords are evident.

In particular, it is possible to manufacture a 3C—SiC layer, having the desired electrical properties of a reduced bandgap and high electron mobility, in a rapid and inexpensive manner, and integrable into known industrial processes.

Moreover, the Applicant has verified that the 3C—SiC layer thus manufactured has a low defect density.

The possibility of manufacturing the 3C—SiC layer on a 4H—SiC substrate allows to take full advantage of the silicon carbide properties.

Furthermore, the heating and melting process occurs in a single step, during which it is possible to accurately control the LASER parameters (for example in terms of energy and number of pulses), making the process highly reproducible.

Finally, it is clear that modifications and variations may be made to what has been described and illustrated herein, without thereby departing from the scope of the present disclosure.

A process for working a wafer (1; 21) of 4H—SiC material, may be summarized as including the steps of heating, through a LASER beam (102), a selective portion at a surface (1a, 21a) of the wafer (1; 21) at least up to a melting temperature of the material of said selective portion; allowing the crystallization of the melted selective portion, thus forming a stack of superimposed layers including: a 3C—SiC layer (4; 24) in contact with the 4H—SiC material of the wafer (1; 21), a Silicon layer (6a; 26a) above the 3C—SiC layer (4; 24), and a carbon-rich layer (6b; 26b) above the Silicon layer (6a; 26a); and completely removing said carbon-rich layer (6b; 26b).

The process may further include the step of completely removing said Silicon layer (6a; 26a), exposing the 3C—SiC layer (4; 24).

Said selective portion may be of crystalline 4H—SiC material, in particular a single-crystal 4H—SiC.

The process may further include, before the step of heating, the step of implanting doping species at the surface (1a; 21a), forming an implanted region (3), and said selective portion may include the implanted region (3).

The step of heating may be performed by generating, at the level of the surface (1a; 21a), temperatures between 1600° C. and 3000° C.

The step of allowing the crystallization of said selective portion being melted comprises arranging the wafer (1; 21) in an environment with a temperature between 1600 and 2700° C. for a time between 100 ns and 300 s.

The step of removing said carbon-rich layer (6b; 26b) may include performing an oxidation step of the carbon-rich layer (6b; 26b) forming an oxidized Carbon layer (8; 28), and an etching step of the oxidized Carbon layer (8; 28).

The step of removing said Silicon layer (6a; 26a) may include performing an oxidation step of the Silicon layer (6a; 26a) forming an oxidized Silicon layer (8; 28), and an etching step of the oxidized Silicon layer (8; 28).

Said steps of oxidizing the Silicon layer (6a; 26a) and oxidizing the carbon-rich layer (6b; 26b) may be performed simultaneously, and/or said steps of etching the oxidized Silicon layer (8; 28) and etching the oxidized Carbon layer (8; 28) may be performed simultaneously.

Said LASER beam (102) may be generated according to the following parameters: wavelength between 290 nm and 370 nm; pulse duration between 100 and 300 ns; number of pulses between 1 and 16; and energy density between 1.6 and 5 $J/cm^2$.

Said LASER beam (102) may be generated according to the following parameters: wavelength between 290 nm and 370 nm; pulse duration between 100 and 300 ns; number of pulses between 1 and 16; and energy density between 1.6 and 4 $J/cm^2$.

Said selective portion may have, in plan view, shape and extension coinciding with the shape and extension of the wafer (1; 21).

Said selective portion may have, in plan view, an extension lower than the extension of the wafer (1; 21).

Said selective portion may extend into the wafer (1; 21) up to a maximum depth between 10 and 100 nm.

The carbon-rich layer (6; 26) may include one or more graphene layers and/or one or more graphite layers.

The process may further include the step of forming a 6H—SiC layer (9; 29) interposed between the 4H—SiC material of the wafer (1; 21) and the 3C—SiC layer (4; 24) generating the LASER beam (102) according to the following parameters: wavelength between 290 nm and 370 nm;

pulse duration between 100 and 300 ns; number of pulses between 1 and 16; and energy density between 1.6 and 4 J/cm².

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
   processing a wafer including:
   heating with a LASER beam a selective portion at a surface of the wafer at least up to a melting temperature of a 4H-SiC material at the selective portion;
   allowing crystallization of the selective portion after being melted, thus forming a stack of superimposed layers including:
   a 3C—SiC layer in contact with the 4H—SiC material of the wafer, a Silicon layer over the 3C—SiC layer, and a carbon-rich layer above the Silicon layer; and
   completely removing said carbon-rich layer; and
   completely removing the silicon layer to expose the 3C—SiC layer.

2. The method according to claim 1, wherein the selective portion includes a crystalline 4H—SiC material.

3. The method according to claim 1, further comprising, before the heating with the LASER beam the selective portion, forming an implanted region in the selective portion by implanting doping species at the surface.

4. The method according to claim 1, wherein the heating with the LASER beam is performed by generating, at a level of the surface, temperatures between 1600° C. and 3000° C.

5. The method according to claim 1, wherein the allowing the crystallization of the selective portion after being melted includes arranging the wafer in an environment with a temperature between 160° and 2700° C. for a time between 100 ns and 300 s.

6. The method according to claim 1, wherein the removing the carbon-rich layer includes:
   performing an oxidation of the carbon-rich layer forming an oxidized Carbon layer; and
   etching of the oxidized Carbon layer.

7. The method according to claim 6, wherein the removing the Silicon layer includes:
   performing an oxidation of the Silicon layer forming an oxidized Silicon layer; and
   etching of the oxidized Silicon layer.

8. The method according to claim 7, wherein the oxidation of the Silicon layer and the oxidation of the carbon-rich layer are performed simultaneously, and
   wherein the etching the oxidized Silicon layer and the etching the oxidized Carbon layer are performed simultaneously.

9. The method according to claim 7, wherein the etching the oxidized Silicon layer and etching the oxidized Carbon layer are performed simultaneously.

10. The method according to claim 7, wherein the oxidation of the Silicon layer and the oxidation of the carbon-rich layer are performed simultaneously.

11. The method according to claim 2, wherein the LASER beam is generated according to the following parameters:
    wavelength between 290 nm and 370 nm;
    pulse duration between 100 and 300 ns;
    number of pulses between 1 and 16; and
    energy density between 1.6 and 5 J/cm².

12. The method according to claim 3, wherein the LASER beam is generated according to the following parameters:
    wavelength between 290 nm and 370 nm;
    pulse duration between 100 and 300 ns;
    number of pulses between 1 and 16; and
    energy density between 1.6 and 4 J/cm².

13. The method according to claim 1, wherein said selective portion extends into the wafer up to a maximum depth between 10 and 100 nm.

14. The method according to claim 1, wherein the carbon-rich layer comprises at least one of the following of one or more graphene layers, one or more graphite layers, and one or more graphene and one or more graphite layers.

15. The method according to claim 1, further comprising forming a 6H—SiC layer interposed between the 4H—SiC material of the wafer and the 3C—SiC layer by generating the LASER beam according to the following parameters:
    wavelength between 290 nm and 370 nm;
    pulse duration between 100 and 300 ns;
    number of pulses between 1 and 16; and
    energy density between 1.6 and 4 J/cm².

16. A method, comprising:
    forming a doped layer on a wafer, the wafer including a first silicon carbide polytype layer;
    heating the doped layer with a LASER beam to a melting point of the doped layer;
    after heating the doped layer to the melting point, crystallizing a melted portion of the doped layer into a carbon rich layer and silicon layer and forming a second silicon carbide polytype layer;
    forming an oxidized carbon layer by oxidizing the carbon rich layer;
    forming an oxidized silicon layer by oxidizing the silicon layer;
    removing the oxidized carbon layer by etching the oxidized carbon layer; and
    removing the oxidized silicon layer by etching the oxidized silicon layer.

17. The method of claim 16, wherein:
    the first silicon carbide polytype layer is at least one of the following of a 4H-silicon carbide polytype layer and a 6H-silicon carbide polytype layer;
    the second silicon carbide polytype layer is a 3C-silicon carbide polytype layer;
    forming the oxidized carbon layer and forming the oxidized silicon layer occurs simultaneously with each other; and
    removing the oxidized silicon layer and removing the oxidized silicon layer occurs simultaneously with each other.

18. A method, comprising:
    forming a doped layer on a wafer, the wafer including a first silicon carbide polytype layer;
    forming a second silicon carbide polytype layer and a third silicon carbide polytype layer by heating the doped layer with a LASER beam to a melting point of the doped layer, the second silicon carbide polytype layer being between the first silicon carbide polytype layer and the third silicon carbide polytype layer;

after heating the doped layer to the melting point, crystallizing a melted portion of the doped layer into a carbon rich layer and silicon layer;

forming an oxidized carbon layer by oxidizing the carbon rich layer;

forming an oxidized silicon layer by oxidizing the silicon layer;

removing the oxidized carbon layer by etching the oxidized carbon layer; and removing the oxidized silicon layer by etching the oxidized silicon layer.

19. The method of claim 18, wherein:

the first silicon carbide polytype layer is a 4H-silicon carbide polytype layer;

the second silicon carbide polytype layer is a 6H-silicon carbide polytype layer;

the third silicon carbide polytype layer is a 3C-silicon carbide polytype layer;

forming the oxidized carbon layer and forming the oxidized silicon layer occurs simultaneously with each other; and removing the oxidized silicon layer and removing the oxidized silicon layer occurs simultaneously with each other.

20. The method of claim 1, wherein the LASER beam is generated according to at least the following parameters:

wavelength between 290 nm and 370 nm; and pulse duration between 100 and 300 ns.

* * * * *

UNITED STATES PATENT AND TRADEMARK OFFICE
CERTIFICATE OF CORRECTION

| | | |
|---|---|---|
| PATENT NO. | : 12,374,545 B2 | Page 1 of 1 |
| APPLICATION NO. | : 18/181415 | |
| DATED | : July 29, 2025 | |
| INVENTOR(S) | : Gabriele Bellocchi et al. | |

It is certified that error appears in the above-identified patent and that said Letters Patent is hereby corrected as shown below:

In the Claims

<u>Column 9, Claim 5, Line 47:</u>
"160°" should read: --1600--.

<u>Column 9, Claim 5, Line 48:</u>
"300 s." should read: --300 ns.--.

Signed and Sealed this
Twenty-eighth Day of October, 2025

John A. Squires
*Director of the United States Patent and Trademark Office*